(12) United States Patent
Lee et al.

(10) Patent No.: US 11,327,592 B2
(45) Date of Patent: May 10, 2022

(54) DISPLAY DEVICE

(71) Applicant: LG Display Co., Ltd., Seoul (KR)

(72) Inventors: Saemleenuri Lee, Seoul (KR);
Joon-Suk Lee, Seoul (KR); Do-Hyung Kim, Seoul (KR); Seung-Han Paek, Seoul (KR); Seong-Woo Park, Goyang-si (KR); Seung-Won Yoo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/359,008

(22) Filed: Jun. 25, 2021

(65) Prior Publication Data

US 2021/0325990 A1 Oct. 21, 2021

Related U.S. Application Data

(63) Continuation of application No. 16/667,538, filed on Oct. 29, 2019, now Pat. No. 11,073,928.

(30) Foreign Application Priority Data

Nov. 19, 2018 (KR) .......................... 10-2018-0142357

(51) Int. Cl.
*G06F 3/041* (2006.01)
*H01L 27/32* (2006.01)
(Continued)

(52) U.S. Cl.
CPC .......... *G06F 3/0412* (2013.01); *G06F 3/0416* (2013.01); *G06F 3/0446* (2019.05);
(Continued)

(58) Field of Classification Search
CPC .... G06F 3/0412; G06F 3/0416; G06F 3/0446; G06F 2203/04112; G06F 3/04166; G06F 3/0445; H01L 27/323; H01L 51/5284; H01L 27/322; H01L 27/3246; H01L 27/3248; H01L 27/3258; H01L 51/5225; H01L 51/5253; H01L 27/3276; H01L 27/3244; H01L 51/5203; H01L 51/5237
See application file for complete search history.

(56) References Cited

U.S. PATENT DOCUMENTS 9,405,413 B2 * 8/2016 An .......................... G06F 3/0446
2010/0103121 A1 * 4/2010 Kim ...................... G06F 3/0446
345/173

(Continued)

OTHER PUBLICATIONS

United States Office Action, U.S. Appl. No. 16/667,538, dated Jan. 25, 2021, nine pages.

*Primary Examiner* — Benyam Ketema
(74) *Attorney, Agent, or Firm* — Fenwick & West LLP (57) ABSTRACT

A display device that is capable of being manufactured through a simplified process and at reduced cost is disclosed. The display device is configured such that a plurality of grouped cathode electrodes and a plurality of grouped black matrices intersect each other in the state in which an encapsulation unit is disposed therebetween in order to form a touch sensor, so that a process of forming first and second touch electrodes is omitted and a separate adhesion process becomes unnecessary, whereby structural simplification is achieved while costs are reduced.

9 Claims, 9 Drawing Sheets

(51) Int. Cl.
*H01L 51/52* (2006.01)
*G06F 3/044* (2006.01)

(52) U.S. Cl.
CPC ........ *H01L 27/323* (2013.01); *H01L 51/5284* (2013.01); *H01L 27/322* (2013.01); *H01L 27/3246* (2013.01); *H01L 27/3248* (2013.01); *H01L 27/3258* (2013.01); *H01L 51/5225* (2013.01); *H01L 51/5253* (2013.01)

(56) References Cited

U.S. PATENT DOCUMENTS

| | | | |
|---|---|---|---|
| 2014/0176492 A1 | 6/2014 | An et al. | |
| 2015/0153779 A1 | 6/2015 | Ko et al. | |
| 2016/0132153 A1* | 5/2016 | Lin | G06F 3/0446 345/174 |
| 2017/0235414 A1* | 8/2017 | Ding | G02F 1/136286 345/174 |
| 2018/0006265 A1* | 1/2018 | Oh | H01L 51/5206 |
| 2018/0095566 A1* | 4/2018 | Lee | G06F 3/0412 |
| 2018/0175116 A1* | 6/2018 | Song | G06F 3/0412 |
| 2018/0182821 A1* | 6/2018 | Yun | H01L 27/3258 |
| 2018/0348910 A1* | 12/2018 | Lee | G06F 3/0445 |
| 2019/0123112 A1* | 4/2019 | Lee | H01L 51/0097 |

\* cited by examiner

DISPLAY DEVICE

CROSS-REFERENCE TO RELATED APPLICATIONS

This application is a continuation of U.S. patent application Ser. No. 16/667,538 filed on Oct. 29, 2019, which claims the benefit of Republic of Korea Patent Application No. 10-2018-0142357 filed on Nov. 19, 2018, each of which is hereby incorporated by reference in its entirety.

FIELD OF TECHNOLOGY

The present disclosure relates to a display device, and more particularly to a display device that is capable of being manufactured through a simplified process and at reduced cost.

BACKGROUND

A touchscreen is an input device that allows a user to input a command by selecting one of multiple instructions displayed on a screen, such as that of a display device, using a user's hand or an object. That is, the touchscreen converts the contact position, at which the user's hand or the object directly contacts the touchscreen, into an electrical signal to receive the instruction selected at the contact position as an input signal. Use of such a touchscreen has been increasing, since the touchscreen can replace a separate input device that must be connected to the display device for operation, such as a keyboard or a mouse.

In many cases, the touchscreen is generally attached to the front surface of a display panel, such as a liquid crystal display panel or an organic light-emitting display device, using an adhesive. Such a configuration may incur limitations or problems. For instance, since the touchscreen is separately manufactured and is then attached to the display panel, the process is complicated, and costs are increased. In addition, a touch pad for providing a driving signal to the touchscreen is formed on a substrate for the touchscreen, whereby the size of a bezel area is increased.

SUMMARY

Accordingly, the present disclosure is directed to a display device that substantially obviates one or more problems due to the limitations and disadvantages of the related art.

An aspect of the present disclosure is to provide a display device that is capable of being manufactured through a simplified process and at reduced cost.

Additional advantages, aspects, and features of the invention will be set forth in part in the description which follows and in part will become apparent to those having ordinary skill in the art upon examination of the following, or may be learned from practice of the invention. The aspects and other advantages of the invention may be realized and attained by the structure particularly pointed out in the written description and claims hereof as well as the appended drawings.

To realize these aspects and other advantages and in accordance with the aspect of the disclosure, as embodied and broadly described herein, a display device is configured such that a plurality of grouped cathode electrodes and a plurality of grouped black matrices intersect each other in the state in which an encapsulation unit is disposed therebetween in order to form a touch sensor, so that a process of forming first and second touch electrodes is omitted and a separate adhesion process becomes unnecessary, whereby structural simplification is achieved while costs are reduced.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Hereinafter, exemplary embodiments of an organic light-emitting display device according to the present invention will be described in detail with reference to the accompanying drawings so that the present invention will be easily realized by those skilled in the art.

Figure 1:
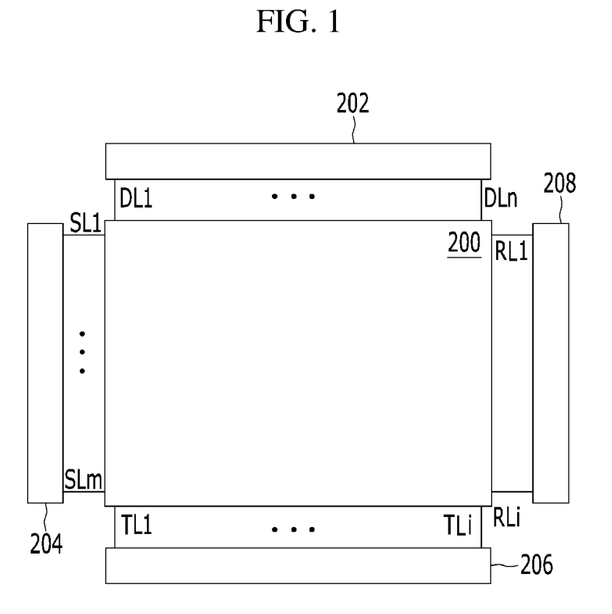
FIG. 1 is a block diagram showing a display device according to one embodiment of the present disclosure.

FIG. 1 is a block diagram showing a display device according to the present disclosure.

The display device shown in FIG. 1 includes a display panel 200, a first touch-driving unit 206, a second touch-driving unit 208, a scan-driving unit 204, and a data-driving unit 202.

The scan-driving unit 204 sequentially supplies a scan signal to a plurality of scan lines SL (including SL1 to SLm) of the display panel 200 to sequentially drive the scan lines SL. The scan-driving unit 204 is formed on a substrate of the display panel 200 using at least one of a thin film transistor having an oxide semiconductor layer or a thin film transistor having a polycrystalline semiconductor layer. At this time, the thin film transistor of the scan-driving unit 204 is formed simultaneously with at least one thin film transistor disposed in each subpixel in the same process as the at least one thin film transistor disposed in each subpixel.

The data-driving unit 202 supplies data voltages to a plurality of data lines DL (including DL1 to DLn) of the display panel 200 in order to drive the data lines DL.

The first touch-driving unit 206 supplies a driving pulse to first touch electrodes through first touch-routing lines TL (including TL1 to TLi), and the second touch-driving unit 208 senses variation in charges of touch sensors through second touch-routing lines RL (including RL1 to RLi).

Figure 2:
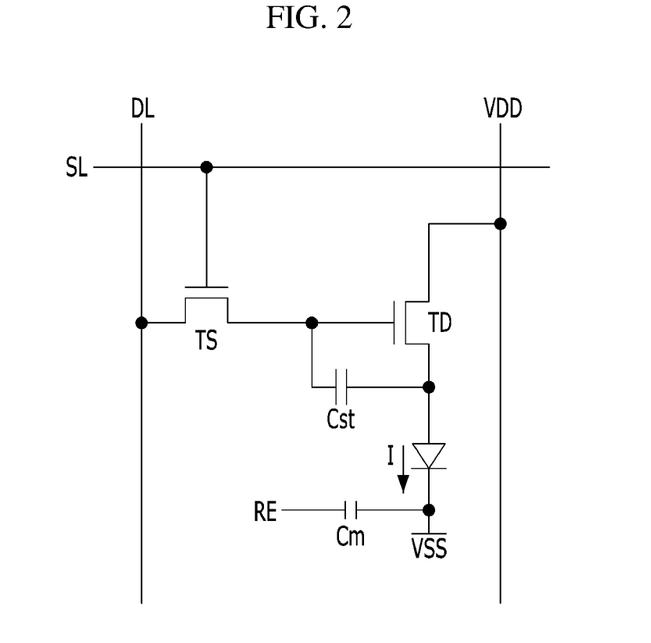
FIG. 2 is a circuit diagram showing each subpixel disposed in a display panel shown in FIG. 1 according to one embodiment of the present disclosure.

The display panel 200 displays an image using a plurality of subpixels arranged in the form of a matrix. As shown in FIG. 2, each subpixel includes a switching transistor TS, a driving transistor TD, a storage capacitor Cst, a light-emitting element (e.g., a diode), and a touch sensor Cm.

Figure 3:
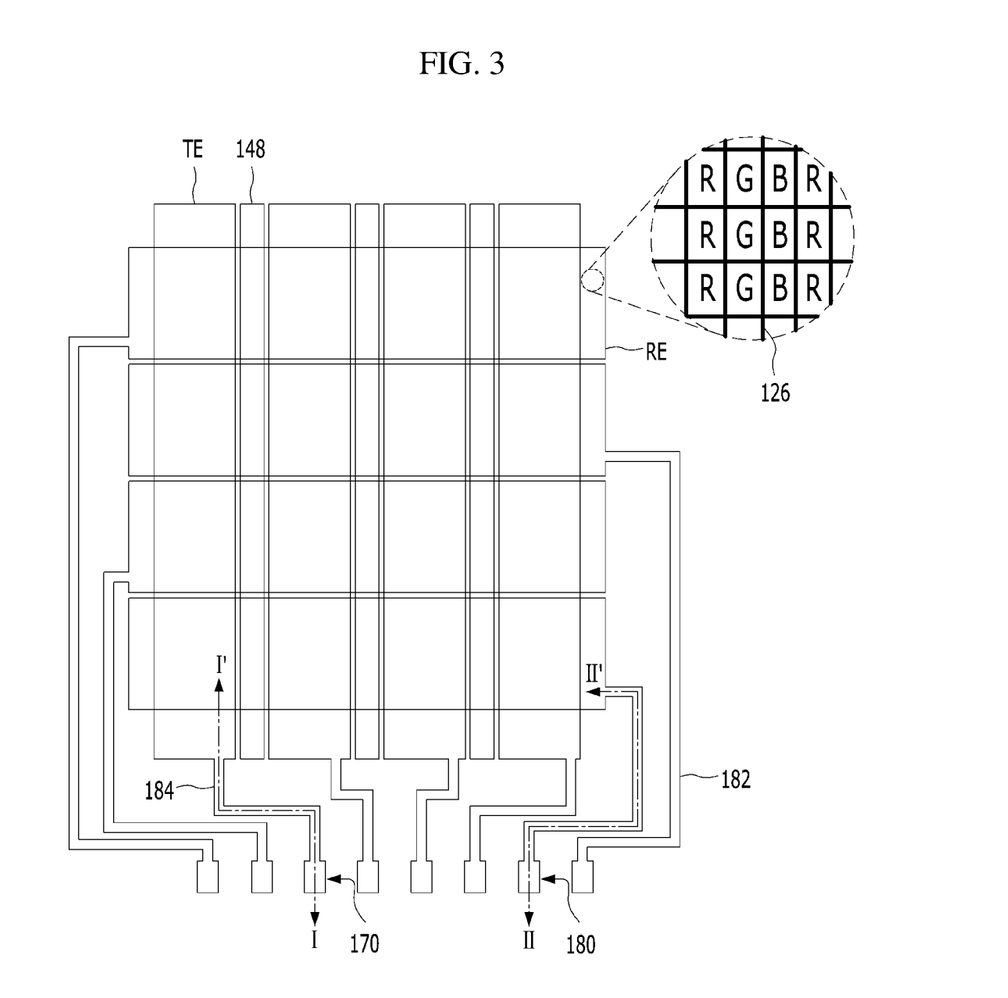
FIG. 3 is a plan view showing, in detail, the display panel shown in FIG. 1 according to one embodiment of the present disclosure.

As shown in FIG. 3, the touch sensor Cm includes a first electrode TE and a second touch electrode RE. The first touch electrodes TE extend in a first direction, and the second touch electrodes RE extend in a second direction. The first direction is a direction parallel to one of the scan lines SL and the data lines DL, and the second direction is a direction parallel to the other of the scan lines SL and the data lines DL.

Figure 4A:
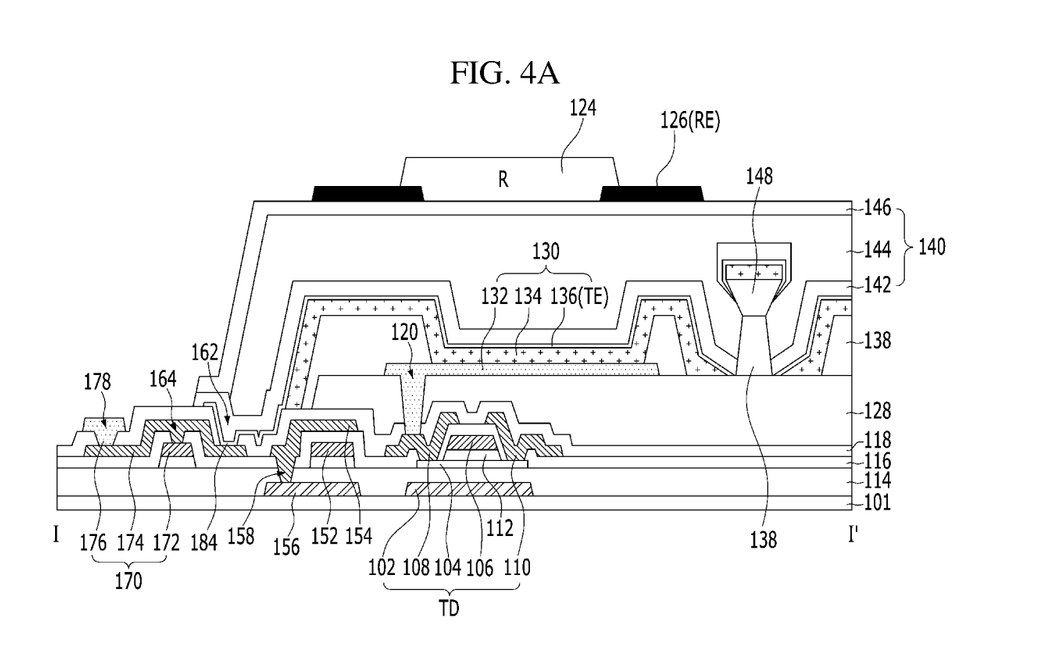
FIGS. 4A and 4B are sectional views of the display device taken along lines I-I' and II-II' of FIG. 3, respectively.
Figure 4B:
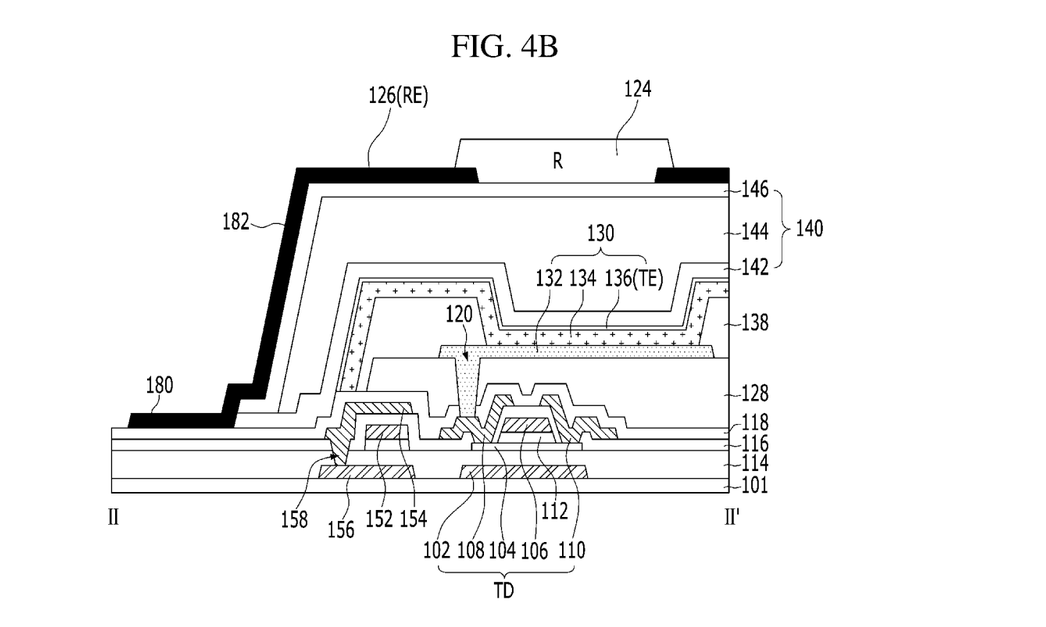

The first and second touch electrodes TE and RE intersect each other in the state in which an encapsulation unit 140 (see FIG. 4) is disposed therebetween, whereby mutual capacitance corresponding to the touch sensor Cm is formed at the intersection between the first and second touch electrodes TE and RE.

When a scan pulse is supplied to the scan line SL, the switching transistor TS is turned on to supply a data signal, which is supplied to the data line DL, to the storage capacitor Cst and to a gate electrode of the driving transistor TD.

In response to the data signal supplied to the gate electrode of the driving transistor TD, the driving transistor TD controls current I that is supplied from a high-voltage (VDD) supply line to the light-emitting element 130 to adjust the amount of light emitted by the light-emitting element 130. Even when the switching transistor TS is turned off, the driving transistor TD supplies uniform current to the light-emitting element 130 using the voltage charged in the storage capacitor Cst such that the light-emitting element 130 keeps emitting light until a data signal of the next frame is supplied.

As shown in FIGS. 4A and 4B, the driving transistor TD includes a semiconductor layer 104 disposed on a buffer layer 114, a gate electrode 106 disposed so as to overlap the semiconductor layer 104 in the state in which a gate dielectric film 112 is disposed therebetween, and source and drain electrodes 110 and 108 formed on an interlayer dielectric film 116 so as to contact the semiconductor layer 104.

The semiconductor layer 104 is made of at least one of an amorphous semiconductor material, a polycrystalline semiconductor material, or an oxide semiconductor material. The semiconductor layer 104 is formed on the buffer layer 114. The semiconductor layer 104 includes a channel area, a source area, and a drain area. The channel area overlaps the gate electrode 106 in the state in which the gate dielectric film 112 is disposed therebetween such that the channel area is formed between the source and drain electrodes 110 and 108. The source area is electrically connected to the source electrode 110 through a source contact hole formed through the gate dielectric film 112 and the interlayer dielectric film 116. The drain area is electrically connected to the drain electrode 108 through a drain contact hole formed through the gate dielectric film 112 and the interlayer dielectric film 116. A light-blocking layer 102 is disposed between the semiconductor layer 104 and a substrate 101 in order to prevent external light from being introduced into the semiconductor layer 104.

The gate electrode 106 is formed on the gate dielectric film 112, and overlaps the channel area of the semiconductor film 104 in the state in which the gate dielectric film 112 is disposed therebetween. The gate electrode 106 may be made of one or an alloy of molybdenum (Mo), aluminum (Al), chrome (Cr), gold (Au), titanium (Ti), nickel (Ni), neodymium (Nd), or copper (Cu), and may have a single-layer structure or a multi-layer structure. However, the present invention is not limited thereto.

The source electrode 110 is connected to the source area of the semiconductor layer 104, which is exposed through the source contact hole formed through the gate dielectric film 112 and the interlayer dielectric film 116. The drain electrode 108 faces the source electrode 110, and is connected to the drain area of the semiconductor layer 104 through the drain contact hole formed through the gate dielectric film 112 and the interlayer dielectric film 116. Each of the source and drain electrodes 110 and 108 may be made of one or an alloy of molybdenum (Mo), aluminum (Al), chrome (Cr), gold (Au), titanium (Ti), nickel (Ni), neodymium (Nd), or copper (Cu), and may have a single-layer structure or a multi-layer structure. However, the present invention is not limited thereto.

The storage capacitor Cst includes first storage electrode 156, second storage electrode 152, and third storage electrode 154. The first storage electrode 156 is formed on the substrate 101, and is made of the same material as the light-blocking layer 102. The second storage electrode 152 is formed on the gate dielectric film 112, and is made of the same material as the gate electrode 106. The third storage electrode 154 is electrically connected to the first storage electrode 156, which is exposed through a storage contact hole 158 formed through the buffer layer 114 and the interlayer dielectric film 116. Consequently, the first storage electrode 156 overlaps the second storage electrode 152 in the state in which the buffer layer 114 and the gate dielectric film 112 are disposed therebetween to form a first storage capacitor, and the third storage electrode 154 overlaps the second storage electrode 152 in the state in which the interlayer dielectric film 116 is disposed therebetween to form a second storage capacitor. At this time, the first and second storage capacitors are connected to each other in parallel.

The light-emitting element 130 includes an anode electrode 132, at least one light-emitting stack 134 formed on the anode electrode 132, and a cathode electrode 136 formed on the light-emitting stack 134.

The anode electrode 132 is electrically connected to the drain electrode 108 of the driving transistor TD, which is exposed through a pixel contact hole 120 formed through a passivation film 118 and a planarization layer 128. The anode electrode 132 of each subpixel is formed to be exposed by a bank 138. The bank 138 may be made of an opaque material (for example, black) to prevent optical interference between adjacent subpixels. In this case, the bank 138 includes a light-blocking material made of at least one of a color pigment, organic black, or carbon.

The at least one light-emitting stack 134 is formed on the anode electrode 132 in a light-emitting area defined by the bank 138. The at least one light-emitting stack 134 is formed by stacking, sequentially or reversely, a hole-related layer, an organic light-emitting layer, and an electron-related layer on the anode electrode 132. In addition, the light-emitting stack 134 may include first and second light-emitting stacks opposite each other in the state in which a charge generation layer is disposed therebetween. In this case, the organic light-emitting layer of one of the first and second light-emitting stacks generates blue light, and the organic light-emitting layer of the other of the first and second light-emitting stacks generates yellow-green light, whereby white light is generated through the first and second light-emitting stacks. The white light generated by the light-emitting stack 134 is incident on a color filter located above or below the light-emitting stack 134, whereby a color image may be realized. In addition, each light-emitting stack 134 may generate color light corresponding to each subpixel without a separate color filter to realize a color image. That is, the light-emitting stack 134 of the red (R) subpixel may generate red light, the light-emitting stack 134 of the green (G) subpixel may generate green light, and the light-emitting stack 134 of the blue (B) subpixel may generate blue light.

The cathode electrode 136 is formed to be opposite the anode electrode 132 in the state in which the light-emitting stack 134 is disposed therebetween.

The cathode electrode 136 also serves as the first touch electrode TE, and is thus grouped into a plurality of parts so as to be connected to first touch-routing lines 184. The cathode electrode 136 is connected to a first touch pad 170 via the first touch-routing line 184. At this time, the first touch-routing line 184 is disposed on at least one dielectric film disposed below the encapsulation unit 140, for example, the passivation film 118. In addition, the first touch-routing line 184 is connected to a touch pad middle electrode 174 exposed through a routing contact hole 162 formed through the passivation film 118.

The first touch pad 170 is disposed to be exposed by the encapsulation unit 140. The first touch pad 170 includes a touch pad lower electrode 172, a touch pad middle electrode 174, and a touch pad upper electrode 176.

The touch pad lower electrode 172 is made of the same material as the gate electrode 106, and is disposed on the gate dielectric film 112.

The touch pad middle electrode 174 is made of the same material as the source and drain electrodes 110 and 108, and is disposed on the interlayer dielectric film 116. The touch pad middle electrode 174 is connected to the touch pad lower electrode 172 through a first pad contact hole 164 formed through the interlayer dielectric film 116.

The touch pad upper electrode 176 is made of the same material as the anode electrode 132, and is disposed on the passivation film 118. The touch pad upper electrode 176 is connected to the touch pad middle electrode 174, which is exposed through a second pad contact hole 178 formed through the passivation film 118.

The encapsulation unit 140 prevents external moisture or oxygen from permeating into the light-emitting element 130, which has low resistance to external moisture or oxygen. To this end, the encapsulation unit 140 includes a plurality of inorganic encapsulation layers 142 and 146 and an organic encapsulation layer 144 disposed between the inorganic encapsulation layers 142 and 146. The inorganic encapsulation layer 146 is disposed in the uppermost layer. In this case, the encapsulation unit 140 includes at least two inorganic encapsulation layers 142 and 146 and at least one organic encapsulation layer 144. In the present disclosure, the structure of the encapsulation unit 140 in which the organic encapsulation layer 144 is disposed between the first and second inorganic encapsulation layers 142 and 146 will be described by way of example.

The first inorganic encapsulation layer 142 is formed on the substrate 101, on which the cathode electrode 136 is formed, to be closest to the light-emitting element 130. The first inorganic encapsulation layer 142 is made of an inorganic dielectric material that is capable of being deposited at a low temperature, such as silicon nitride (SiNx), silicon oxide (SiOx), silicon oxide nitride (SiON), or aluminum oxide ($Al_2O_3$). Since the first inorganic encapsulation layer 142 is deposited in a low-temperature atmosphere, therefore, it is possible to reduce damage to the light-emitting stack 134, which has low resistance to a high-temperature atmosphere, during the process of depositing the first inorganic encapsulation layer 142.

The organic encapsulation layer 144 serves as a buffer for alleviating stress between the respective layers generated due to bending of the organic light-emitting display device, and strengthens a planarization function. The organic encapsulation layer 144 is formed through an inkjet process, and is made of an organic dielectric material, such as an acrylic resin, an epoxy resin, polyimide, polyethylene, or silicon oxycarbide (SiOC).

In the case in which the organic encapsulation layer 144 is formed through an inkjet process, a dam (not shown) is disposed to prevent the organic encapsulation layer 144, which is in a liquid state, from diffusing to the edge of the substrate 101. By the provision of the dam, it is possible to prevent the organic encapsulation layer 144 from diffusing to a pad area, disposed at the outer edge of the substrate 101, in which the first touch pads 170 and display pads (not shown) are disposed.

The second inorganic encapsulation layer 146 is formed on the substrate 101, on which the organic encapsulation layer 144 is formed, to cover the upper surface and the side surface of each of the organic encapsulation layer 144 and the first inorganic encapsulation layer 142. Consequently, the second inorganic encapsulation layer 146 reduces or prevents the permeation of external moisture or oxygen into the first inorganic encapsulation layer 142 and the organic encapsulation layer 144. The second inorganic encapsulation layer 146 is made of an inorganic dielectric material, such as silicon nitride (SiNx), silicon oxide (SiOx), silicon oxide nitride (SiON), or aluminum oxide ($Al_2O_3$).

A color filter array including a color filter 124 and a black matrix 126 is disposed on the encapsulation unit 140. At least one of a polarizing film (not shown) or a cover substrate (not shown) is disposed on the color filter array.

The color filter 124 is disposed on the encapsulation unit 140 to overlap the light-emitting area exposed by the bank 138 formed at each subpixel area. A red (R) color filter 124 is formed on the encapsulation unit 140 in a red subpixel area, a green (G) color filter 124 is formed on the encapsulation unit 140 in a green subpixel area, and a blue (B) color filter 124 is formed on the encapsulation unit 140 in a blue subpixel area.

The black matrix 126 serves to partition respective subpixel areas and to prevent optical interference and screen bleed between adjacent subpixel areas. The black matrix 126 also serves as the second touch electrode RE, and is thus grouped into a plurality of parts to be connected to second touch-routing lines 182. Each of the grouped black matrices 126 is connected to a second touch pad 180 via the second touch-routing line 182 extending from the black matrix 126. The second touch-routing line 182 is disposed along the side surface of the encapsulation unit 140.

The second touch pad 180 is made of the same material as the second touch-routing line 182. The second touch pad 180 is disposed on the dielectric film disposed below the light-emitting element 130, for example, the passivation film 118.

Meanwhile, in the present disclosure, as previously described, the cathode electrode 136 is used as the first touch electrode TE, and the black matrix 126 is used as the second touch electrode RE.

As shown in FIG. 3, the cathode electrode 136 is grouped into a plurality of parts to be used as a plurality of first touch electrodes TE during a touch-sensing period. The cathode electrodes 136 in one group are separated from the cathode electrodes 136 in another group.

Figure 5:
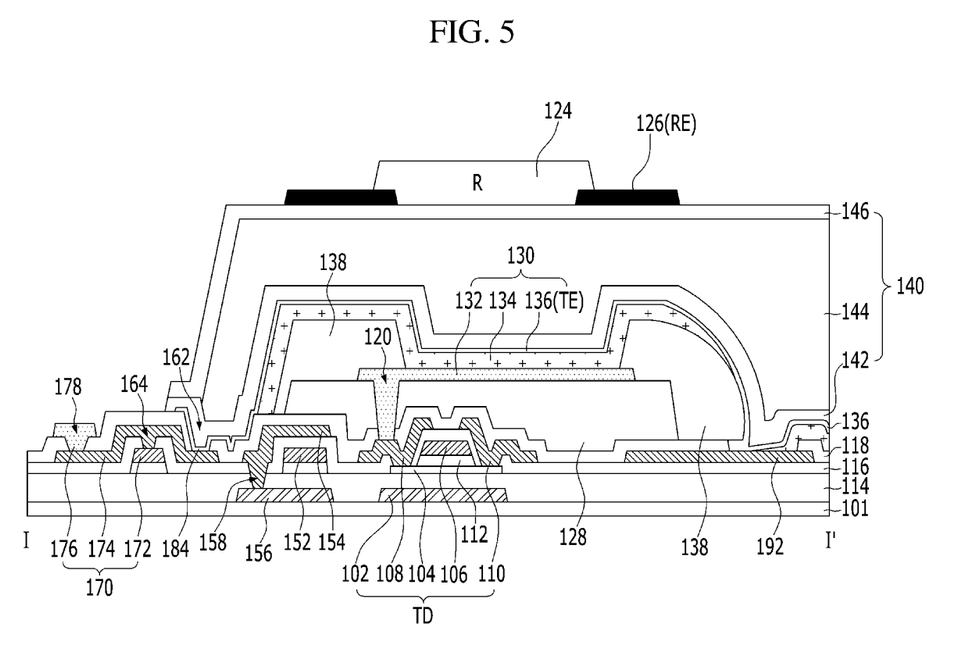
FIG. 5 is a sectional view showing a display device including a passivation film that forms an undercut structure together with a bank according to one embodiment of the present disclosure.

To this end, as shown in FIGS. 3 and 4, inversely tapered partition walls 148 are disposed on the bank 138 between the grouped cathode electrodes 136, whereby the cathode electrode 136 is divided into a plurality of parts by the partition walls 148. In addition, as shown in FIG. 5, a bank 138 forming an undercut structure together with the passivation film 118 is disposed between the grouped cathode electrodes 136, whereby the cathode electrode 136 is divided into a plurality of groups by the bank 138 forming the undercut structure together with the passivation film 118.

The grouped cathode electrodes 136 are not divided from each other for each subpixel but are formed to have a size corresponding to a plurality of subpixel area in consideration of a user's touch area. For example, each of the grouped cathode electrodes 136 is formed in a bar shape to correspond to m subpixels (m being a natural number) in the first direction x n subpixels (n being a natural number greater than m) in the second direction, and is used as a single first touch electrode TE. At this time, the cathode electrode 136 is formed so as to have a structure in which the cathode electrode is longer in the second direction than in the first direction.

Figure 6:
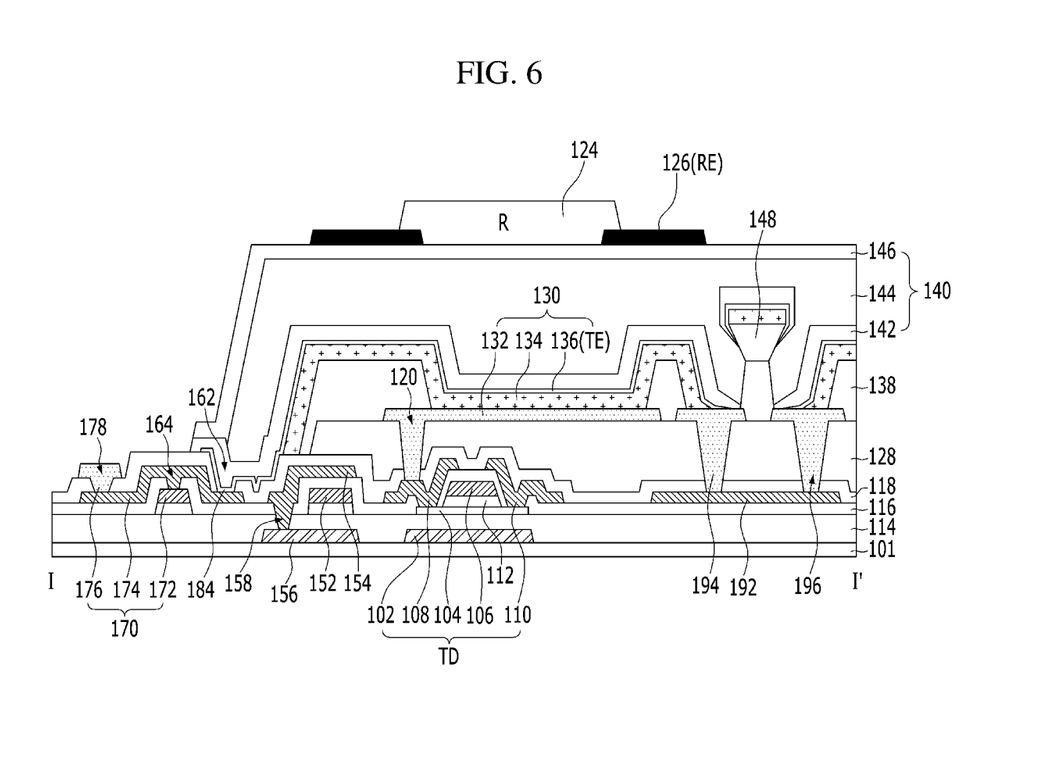
FIG. 6 is a sectional view showing a display device including an auxiliary line according to one embodiment of the present disclosure.

During a display period, a low-voltage (VSS) driving signal is supplied to the cathode electrode 136 through the first touch pad 170 and the first touch-routing line 184, and during a touch-sensing period, a touch-driving signal is supplied to the cathode electrode 136. In addition, a low-voltage driving signal is supplied to the cathode electrode 136 through the first touch pad 170, the first touch-routing line 184, first auxiliary line 192, second auxiliary line 194, shown in FIG. 6, during the display period, and a touch-driving signal is supplied to the cathode electrode 136 during the touch-sensing period. The first auxiliary line 192 is made of the same material as the source and drain electrodes 110 and 108, and is disposed on the interlayer dielectric film 116. The second auxiliary line 194 is made of the same material as the anode electrode 132, and is disposed on the planarization layer 128. The second auxiliary line 194 is connected to the first auxiliary line 192, which is exposed through an auxiliary contact hole 196 formed through the passivation film 118 and the planarization layer 128. In addition, the second auxiliary line 194 is connected to the cathode electrode 136. Meanwhile, since the first and second auxiliary lines 192 and 194 are disposed between the grouped cathode electrodes 136, the low-voltage (VSS) driving signal and the touch-driving signal are supplied to the respective cathode electrodes 136 through the first and second auxiliary lines 192 and 194.

Figure 7A:
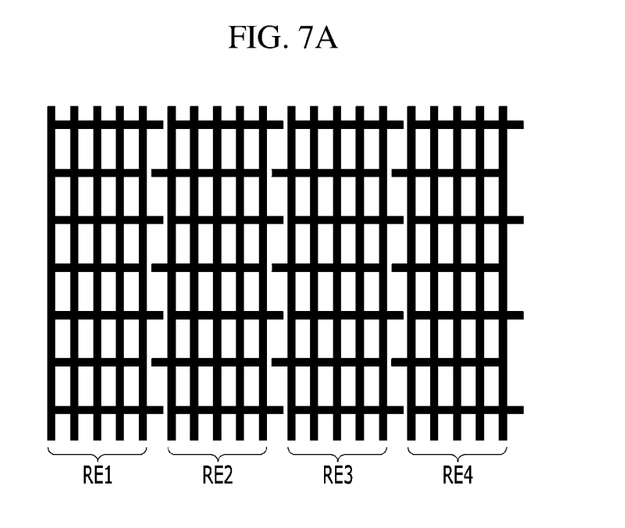
FIGS. 7A and 7B are plan views showing various embodiments of a second touch electrode shown in FIG. 3 according to one embodiment of the present disclosure.
Figure 7B:
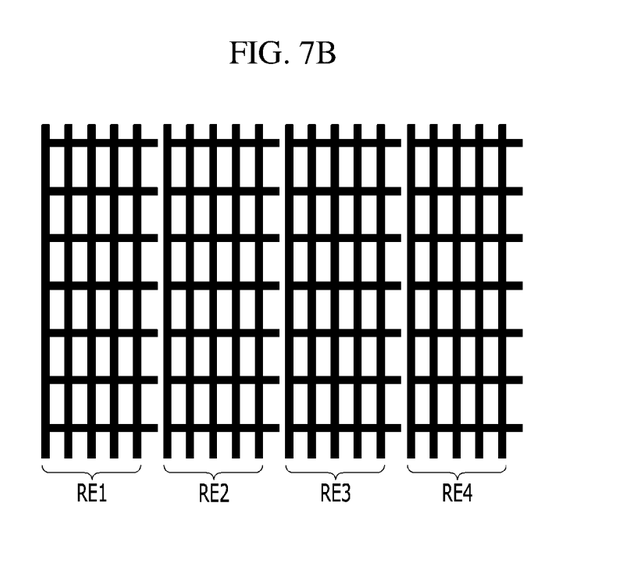

The black matrix 126 is made of an opaque conductive material. As shown in FIGS. 7A and 7B, the black matrix 126 is grouped into a plurality of parts, and is used as the second touch electrode RE during the touch-sensing period. The black matrices 126 in one group are separated from the black matrices 126 in another group. Each of the grouped black matrices 126 is formed in a mesh shape to correspond to n subpixels (n being a natural number greater than m) in the first direction x m subpixels (m being a natural number) in the second direction, and is used as a single second touch electrode RE. At this time, the black matrix 126 is formed so as to have a structure in which the black matrix is longer in the first direction than in the second direction.

The black matrices 126 included in each of the second touch electrodes RE1, RE2, RE3, RE4, . . . are electrically connected to each other. The black matrices 126 between adjacent second touch electrodes RE1, RE2, RE3, RE4, . . . are separated from each other. For example, adjacent second touch electrodes RE1, RE2, RE3, RE4, . . . are spaced apart from each other in the state in which a zigzag space is provided therebetween, as shown in FIG. 7A, or are spaced apart from each other in the state in which a linear space is provided therebetween, as shown in FIG. 7B. The second touch electrodes RE are used as the black matrices 126, which are not disposed in the light-emitting area, thereby improving visibility. In particular, the second touch electrodes RE shown in FIG. 7A are superior to the second touch electrodes RE shown in FIG. 7B in terms of visibility.

In the present disclosure, as described above, the cathode electrode 136 is used as the first touch electrode TE, and the black matrix 126 is used as the second touch electrode RE. That is, the touch sensor Cm having mutual capacitance is formed at the intersection between the cathode electrode 136 and the black matrix 126 during the touch-sensing period. In the present disclosure, therefore, it is possible to omit the process of forming the first and second touch electrodes TE and RE, and a separate adhesion process becomes unnecessary, whereby structural simplification is achieved while costs are reduced.

In addition, the first touch pad 170 connected to the cathode electrode 136, used as the first touch electrode TE, and the second touch pad 180 connected to the black matrix 126, used as the second touch electrode RE, are formed on the substrate 101, on which the display pads are disposed, thereby realizing a slim and narrow bezel.

Figure 8:
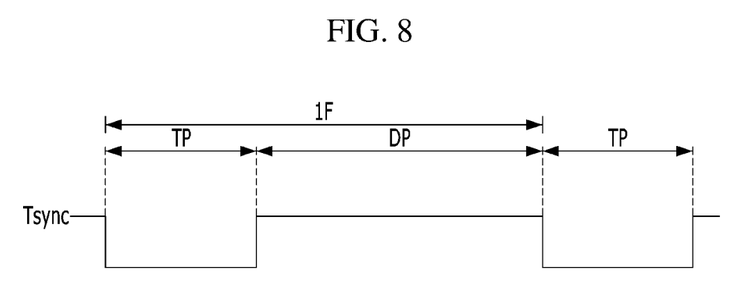
FIG. 8 is a waveform view showing a control signal for selecting a display period and a touch-sensing period of a display device having a touch sensor according to one embodiment of the present disclosure.

FIG. 8 is a waveform view showing the waveform of a signal supplied to a display device having a touch sensor according to the present invention during one frame.

Referring to FIG. 8, one frame period 1F is temporally divided into a display period DP and a touch-sensing period TP. One touch-sensing period TP is allocated between two display periods DP. Alternatively, one display period DP is allocated between two touch-sensing periods TP.

Figure 9A:
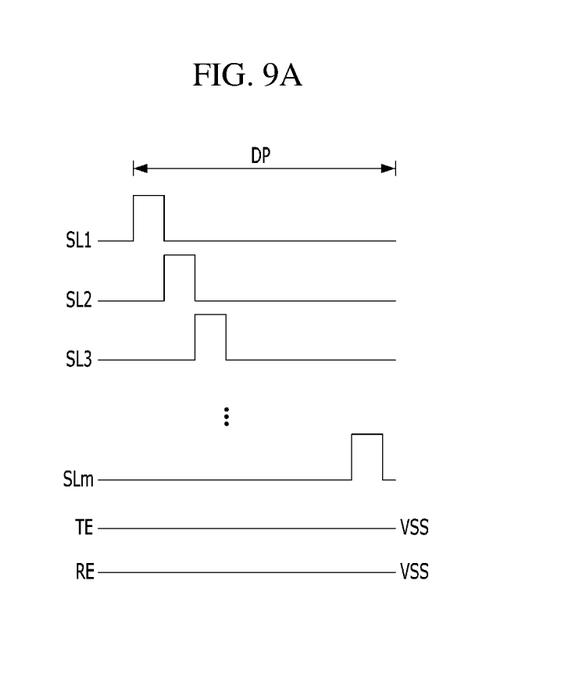
FIGS. 9A and 9B are waveform views showing the waveforms of signals supplied to the display device having the touch sensor according to one embodiment of the present disclosure during the display period and the touch-sensing period.

During the display period DP, as shown in FIG. 9A, a pixel-driving signal (for example, a scan signal, a data signal, a low-voltage driving signal, or a high-voltage driving signal) is supplied to each subpixel. Here, the scan signal is the voltage of a gate pulse that is supplied to each scan line SL, the data signal is the data voltage of an input image that is supplied to the data line DL during the display period, the low-voltage (VSS) driving signal is the voltage supplied to the cathode electrode 136 of each light-emitting element 130 during the display period DP, and the high-voltage (VDD) driving signal is the voltage supplied to the drain electrode 108 of each driving transistor TD during the display period DP.

During the display period DP, the same low-voltage (VSS) driving signal is supplied to the cathode electrode 136, which is used as the first touch electrode TE, and the black matrix 126, which is used as the second touch electrode RE. Consequently, it is possible to prevent a touch-sensing operation from being performed during the display period DP.

Figure 9B:
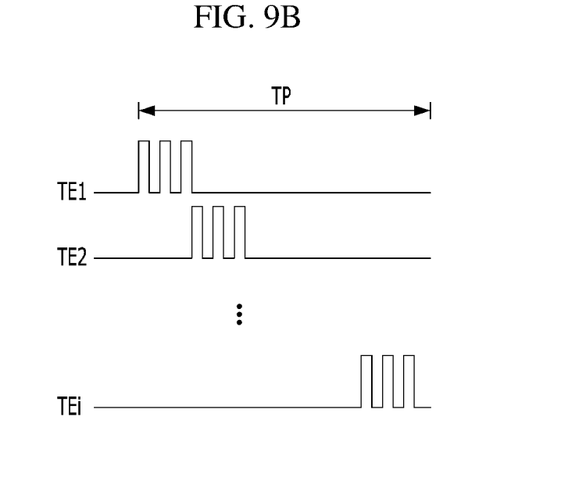

During the touch-sensing period TP, as shown in FIG. 9B, touch-driving signals are sequentially supplied to the cathode electrodes 136, which are used as the first touch electrodes TE1, TE2, . . . , TEi, in response to a touch control signal Tsync from a timing controller (not shown). Subsequently, a change in the electric potential of the black matrices 126, which are used as the second touch electrodes RE1, RE2, RE3, . . . , is sensed in order to sense a touch position.

Meanwhile, although the structure in which the cathode electrode 136 is used as the first touch electrode TE and the black matrix 126 is used as the second touch electrode RE has been described by way of example in the present invention, the cathode electrode 136 may be used as the second touch electrode RE, and the black matrix 126 may be used as the first touch electrode TE.

As is apparent from the above description, in the present disclosure, a cathode electrode is grouped into a plurality of parts so as to be used as first touch electrodes, and a black matrix, which intersects the cathode electrode, is grouped into a plurality of parts so as to be used as second touch electrodes. Consequently, it is possible to omit a process of forming the first and second touch electrodes, and a separate adhesion process becomes unnecessary, thereby achieving structural simplification while reducing costs.

In addition, touch pads connected to the first and second touch electrodes are formed on a substrate on which display pads are disposed, thereby realizing a slim and narrow bezel.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display device comprising:
   a light-emitting element disposed on a substrate, the light-emitting element comprising a plurality of grouped cathode electrodes;
   an encapsulation unit disposed on the light-emitting element;
   a plurality of grouped black matrices disposed on the encapsulation unit, the plurality of grouped black matrices intersecting the plurality of grouped cathode electrodes;
   first touch-routing lines connected to the plurality of grouped cathode electrodes; and
   second touch-routing lines connected to the plurality of grouped black matrices.

2. The display device according to claim 1, further comprising:
   at least one dielectric film disposed below the encapsulation unit,
   wherein the first touch-routing lines are disposed on the dielectric film, and the second touch-routing lines are disposed along a side surface of the encapsulation unit.

3. The display device according to claim 1, wherein the plurality of grouped cathode electrodes are separated from each other, and the plurality of grouped black matrices are separated from each other.

4. The display device according to claim 1, wherein each of the plurality of grouped black matrices is formed in a mesh shape, and each of the plurality of grouped cathode electrodes is formed in a bar shape.

5. The display device according to claim 1, wherein the plurality of grouped black matrices are spaced apart from each other in a state in which a zigzag space or a linear space is provided therebetween.

6. The display device according to claim 1, further comprising a color filter disposed on the encapsulation unit.

7. A display device comprising:
   a light-emitting element disposed on a substrate, the light-emitting element comprising a plurality of grouped cathode electrodes;
   an encapsulation unit disposed on the light-emitting element;
   a plurality of grouped black matrices disposed on the encapsulation unit, the plurality of grouped black matrices intersecting the plurality of grouped cathode electrodes; and
   a partition wall disposed between the plurality of grouped cathode electrodes.

8. The display device according to claim 7, wherein the partition wall intersects the plurality of grouped black matrices.

9. A display device comprising:
   a light-emitting element disposed on a substrate, the light-emitting element comprising a plurality of grouped cathode electrodes;
   an encapsulation unit disposed on the light-emitting element;
   a plurality of grouped black matrices disposed on the encapsulation unit, the plurality of grouped black matrices intersecting the plurality of grouped cathode electrodes;
   a thin film transistor connected to an anode electrode of the light-emitting element;
   a passivation film disposed between the thin film transistor and the anode electrode; and
   a bank disposed so as to expose the anode electrode, wherein the bank, which forms an undercut structure together with the passivation film, is disposed between the plurality of grouped cathode electrodes.

* * * * *